(12) United States Patent
Kuwahara (10) Patent No.: US 8,777,496 B2
(45) Date of Patent: Jul. 15, 2014

(54) OPTICAL DEVICE

(75) Inventor: Ryo Kuwahara, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 363 days.

(21) Appl. No.: 13/268,187

(22) Filed: Oct. 7, 2011

(65) Prior Publication Data
US 2012/0087136 A1    Apr. 12, 2012

(30) Foreign Application Priority Data
Oct. 7, 2010    (JP) .................... 2010-227831

(51) Int. Cl.
G02B 6/36    (2006.01)
H05K 1/00    (2006.01)
H05K 5/00    (2006.01)
B60Q 3/04    (2006.01)

(52) U.S. Cl.
USPC ......... 385/88; 361/679.01; 361/749; 362/362

(58) Field of Classification Search
USPC ................. 385/88; 361/679.01, 749; 362/362
See application file for complete search history.

(56) References Cited

U.S. PATENT DOCUMENTS 7,585,100 B2 *    9/2009   Aoki et al. ............. 362/634
2007/0230875 A1    10/2007  Hino et al.

FOREIGN PATENT DOCUMENTS

JP    2007-264508 A    10/2007

* cited by examiner

*Primary Examiner* — Jerry Blevins
(74) *Attorney, Agent, or Firm* — Westerman, Hattori, Daniels & Adrian, LLP (57) ABSTRACT

An optical device includes: a chassis that receives an optical element; a first terminal that is extended from a bottom face of the chassis and is electrically connected to the optical element; a second terminal that is extended from a side face of the chassis and is electrically connected to the optical element; a projection portion that is provided on the bottom face of the chassis and a top face of the projection portion is higher than a distal end of the first terminal.

19 Claims, 11 Drawing Sheets

OPTICAL DEVICE

CROSS-REFERENCE TO RELATED APPLICATION

This application is based upon and claims the benefit of priority of the prior Japanese Patent Application No. 2010-227831, filed on Oct. 7, 2010, the entire contents of which are incorporated herein by reference.

BACKGROUND (i) Technical Field

The present invention relates to an optical device.

(ii) Related Art

An optical device has an optical element converting an optical signal into an electrical signal or converting an electrical signal into an optical signal. The optical element is housed in a chassis structuring the optical device. The chassis has a plurality of terminals for inputting an electrical signal from outside or outputting an electrical signal to outside.

There is known an optical device having a structure in which a plurality of terminals are provided on a side wall of a chassis. Japanese Patent Application Publication No. 2007-264508 discloses an optical device having a structure in which a control circuit is connected to a print substrate. There is known a method for connecting the optical device and the print substrate with use of a flexible printed circuit board.

SUMMARY

A function of an optical device gets higher and higher. As a result, the number of terminal tends to increase. However, there is a limitation on miniaturization of the terminal. Therefore, there is a limitation on the number of the terminal extended from a sidewall of an optical device.

It is an object of the present invention to provide an optical device in which the number of terminal extended from a side wall of the optical device can be increased.

According to an aspect of the present invention, there is provided an optical device including: a chassis that receives an optical element; a first terminal that is extended from a bottom face of the chassis and is electrically connected to the optical element; a second terminal that is extended from a side face of the chassis and is electrically connected to the optical element; a projection portion that is provided on the bottom face of the chassis and a top face of the projection portion is higher than a distal end of the first terminal.

DETAILED DESCRIPTION

A description will be given of a best mode for carrying the present invention.

First Embodiment

Figure 1A:
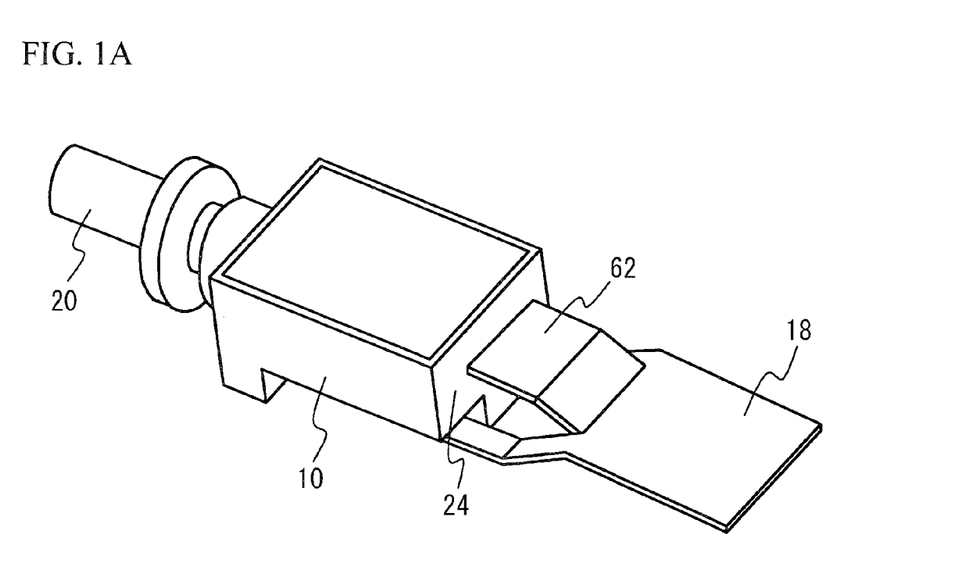
FIG. 1A illustrates a perspective view of an optical device in accordance with a first embodiment viewed from an upper face side.
Figure 1B:
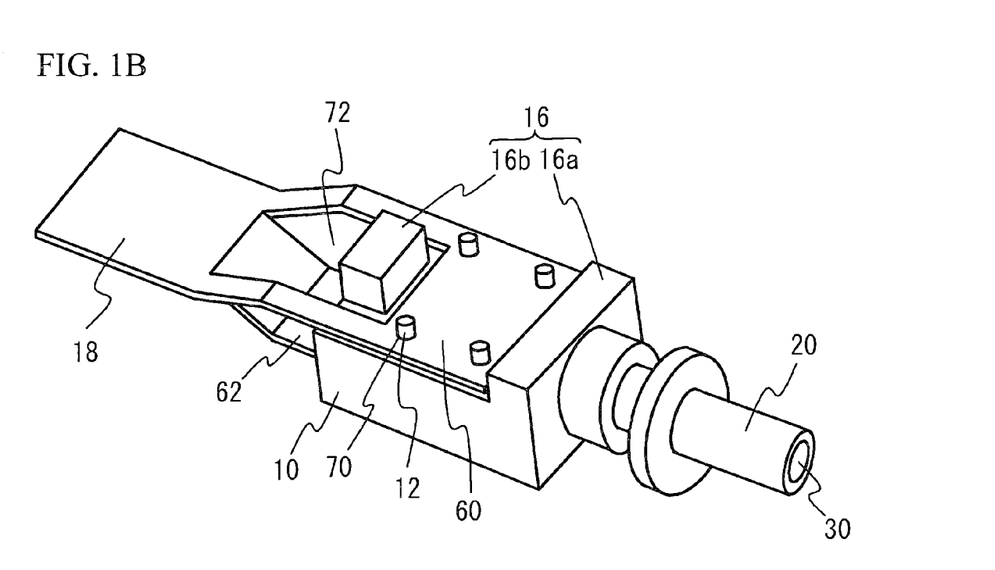
FIG. 1B illustrates a perspective view of the optical device viewed from a bottom face side.
Figure 2:
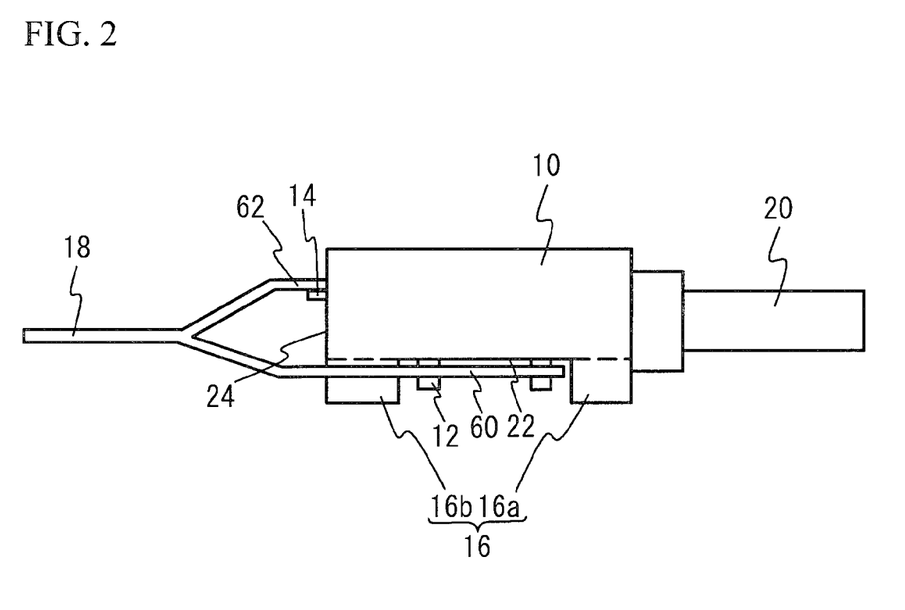
FIG. 2 illustrates a side view of the optical device.

FIG. 1A illustrates a perspective view of an optical device in accordance with a first embodiment viewed from an upper face side. FIG. 1B illustrates another perspective view of the optical device viewed from a bottom face side. In FIG. 1A and FIG. 1B, a wiring pattern or a connector terminal formed on a flexible printed circuit board is omitted for simplification. FIG. 2 illustrates an example of a side view of the optical device. As illustrated in FIG. 1A through FIG. 2, the optical device in accordance with the first embodiment has a chassis 10, a first terminal 12, a second terminal 14, a projection portion 16, a flexible printed circuit board 18 and a receptacle 20. The chassis 10 houses an optical element therein that is a light-emitting element or a light-receiving element. The first terminal 12 penetrates a bottom wall of the chassis 10 and is extended from a bottom face 22 to outside. The second terminal 14 penetrates a sidewall that stands up with respect to the bottom wall of the chassis 10 and is extended from a first side face 24. The projection portion 16 is provided on the bottom face 22 of the chassis 10. The flexible printed circuit board 18 is used for an electrical coupling from the first terminal 12 and the second terminal 14 to a print substrate on which a control circuit is mounted. An optical fiber is inserted into the receptacle 20. The flexible printed circuit board 18 extracts an electrical signal of the first terminal 12 to the first side face 24 side of the chassis 10, as well as the second terminal 14.

Figure 3:
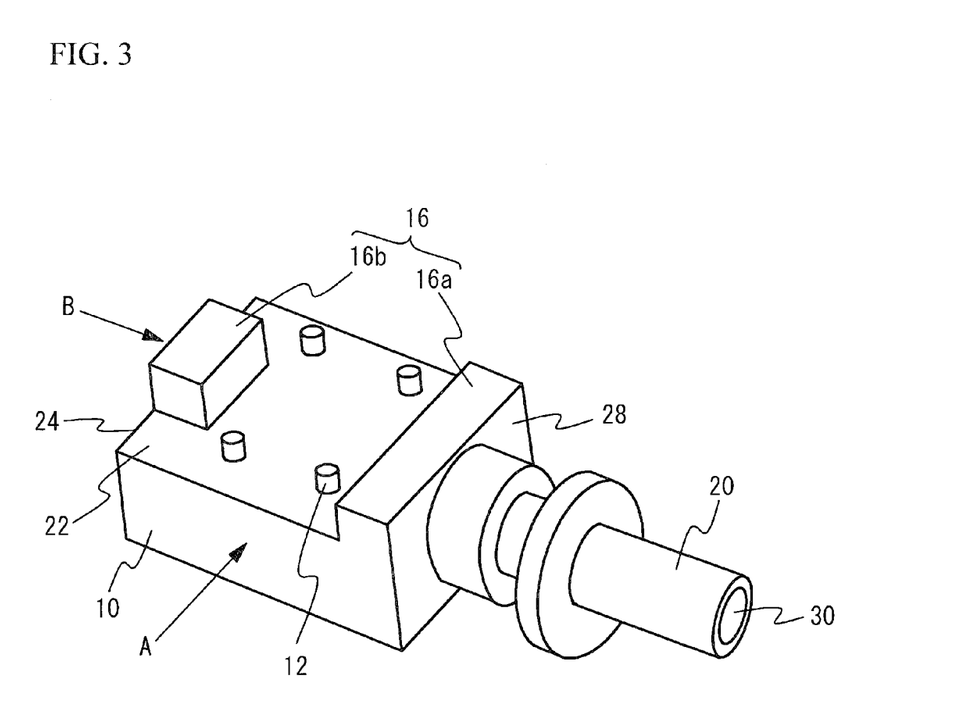
FIG. 3 illustrates a perspective view of a chassis viewed from a bottom face side.
Figure 4A:
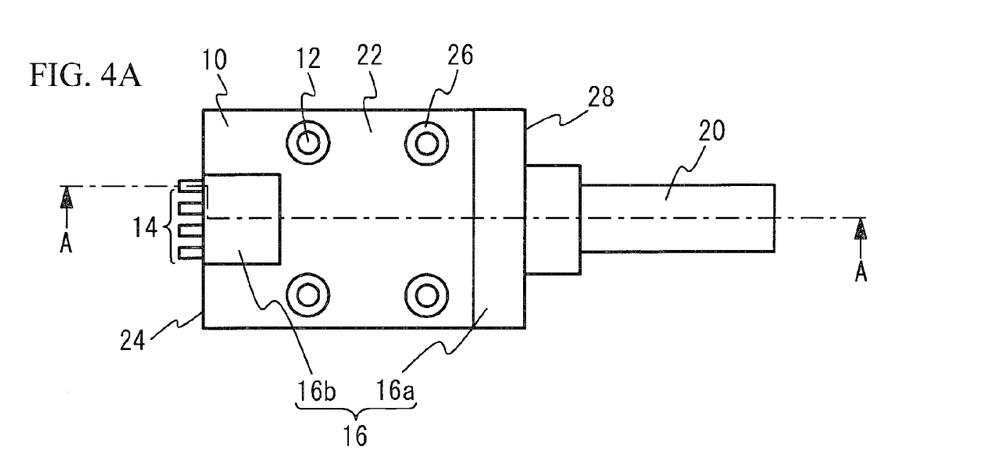
FIG. 4A illustrates a bottom view of the chassis.
Figure 4B:
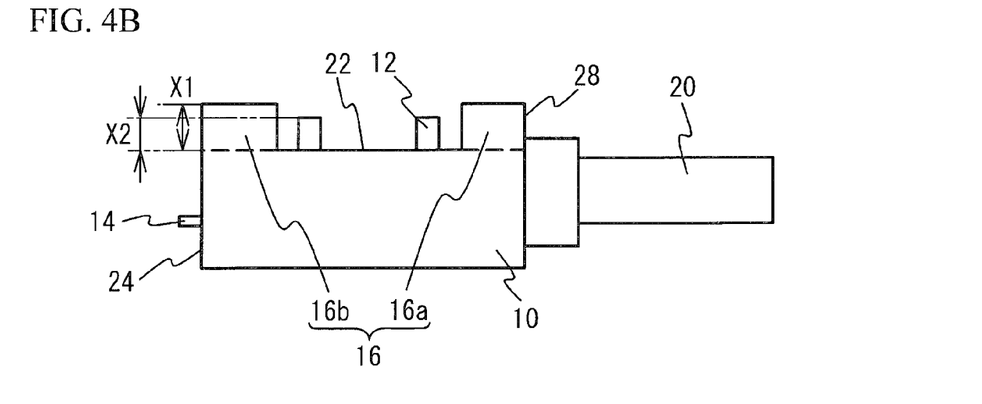
FIG. 4B illustrates a side view of the chassis from A side of FIG. 3.
Figure 4C:
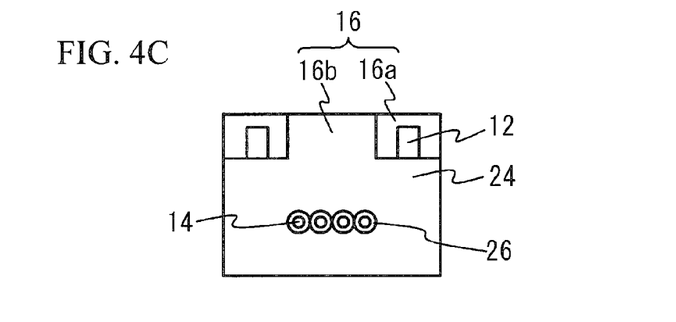
FIG. 4C illustrates a side view of the chassis from B side of FIG. 3.

A description will be given of the chassis 10 with reference to FIG. 3 through FIG. 4C. FIG. 3 illustrates a perspective view of the chassis 10 viewed from a bottom face side. FIG. 4A illustrates a bottom view of the chassis 10. FIG. 4B illustrates a side view of the chassis 10 viewed from A side of FIG. 3. FIG. 4C illustrates another side view of the chassis 10 viewed from B side of FIG. 3. As illustrated in FIG. 3 through FIG. 4C, a plurality of the first terminals 12 project from the bottom face 22 of the chassis 10. A plurality of the second terminals 14 project from the first side face 24 of the chassis 10. The first terminal 12 is, for example, a terminal for supplying electrical power to an optical element housed in the chassis 10. The second terminal 14 is, for example, a terminal for inputting an electrical signal to be converted into an optical signal at the optical element or a terminal for outputting an electrical signal obtained by a conversion of an optical signal at the optical element. That is, the second terminal 14 is a terminal for inputting or outputting an electrical signal with respect to the optical element.

The chassis 10 is made of a metal such as a kovar (iron-nickel-cobalt alloy). The first terminal 12 and the second terminal 14 are made of a metal such as a kovar subjected to an Au plating. An insulator 26 such as a sealing glass is provided around the first terminal 12 and the second terminal 14 in order to prevent an electrical coupling between the first terminal 12 and the chassis 10 or between the second terminal 14 and the chassis 10.

The receptacle 20 is coupled to a second side face 28 of the chassis 10 that is positioned at an opposite side of the first side face 24. The receptacle 20 is made of a metal such as a kovar. A hole 30 is formed in the receptacle 20. An optical fiber is inserted into the hole 30. Thus, the second terminal 14 is provided on the first side face 24 of the chassis 10, and the receptacle 20 is provided on the second side face 28 of the chassis 10 that is located on the opposite side of the first side face 24.

The projection portion 16 is provided on the bottom face 22 of the chassis 10. The projection portion 16 includes a first projection portion 16a and a second projection portion 16b. The first projection portion 16a forms the same plane as the second side face 28 to which the receptacle 20 is coupled. The second projection portion 16b forms the same plane as the first side face 24 that is located on the opposite side of the second side face 28. The projection portion 16 projects more than the first terminal 12. That is, a height X1 from the bottom face 22 of the chassis 10 to the upper face of the projection portion 16 is larger than a height X2 from the bottom face 22 of the chassis 10 to the upper face of the first terminal 12.

The projection portion 16 may be formed as a single piece integral with the chassis 10. The projection portion 16 may be formed separately from the chassis 10, and, after that, the projection portion 16 may be coupled to the chassis 10 with soldering, welding or the like. When the projection portion 16 is formed separately from the chassis 10, a material of the projection portion 16 may not be the same as that of the chassis 10. In this case, the projection portion 16 may be made of an insulating material such as plastic if the insulating material has a given strength. However, it is preferable that the projection portion 16 is made of a material having high thermal conductivity from a view of radiation performance described later. In the first embodiment, the projection portion 16 is made of a metal such as a kovar as well as the chassis 10.

Figure 5:
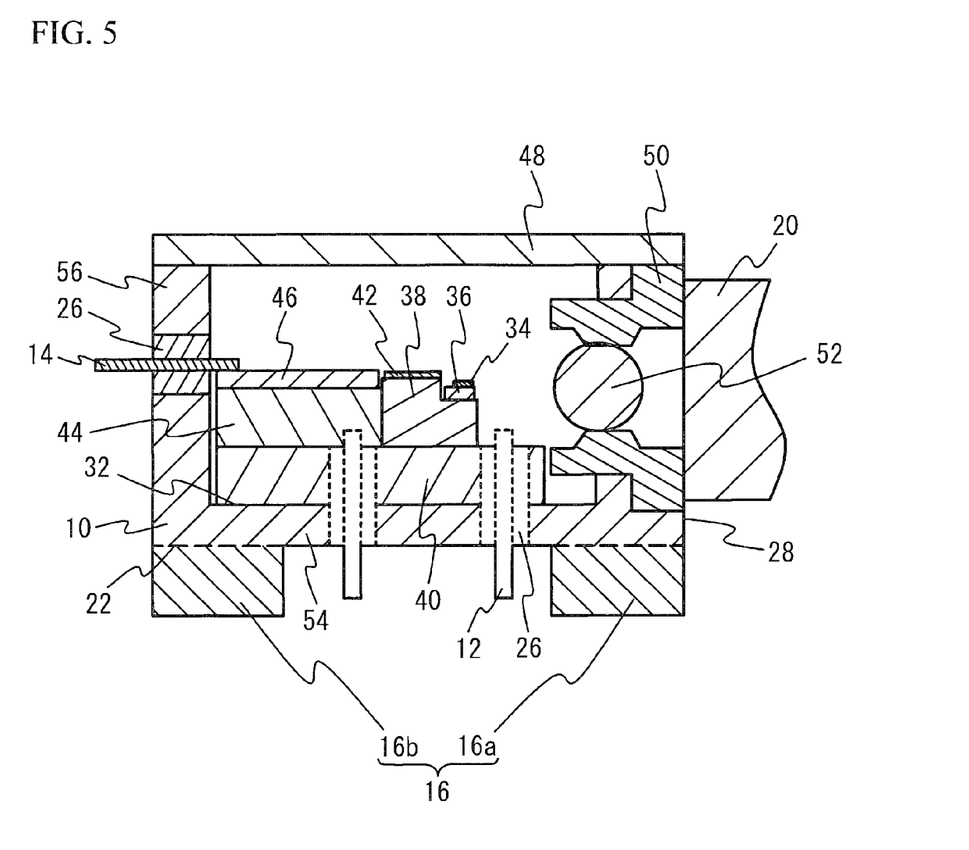
FIG. 5 illustrates a cross sectional view taken along a line A-A of FIG. 4A in a case where the optical element is an LD (laser diode)

FIG. 5 illustrates a cross sectional view taken along an A-A line of FIG. 4A. FIG. 5 illustrates a case where the optical element housed in the chassis 10 is a light-emitting element such as a laser diode. As illustrated in FIG. 5, a mount substrate 40 made of a metal is provided on an inner bottom face of a cavity of the chassis 10. A sub mount substrate 38 made of a metal and a print substrate 44 made of an insulator are mounted on the mount substrate 40. An LD (laser diode) mount substrate 36 where an LD 34 is mounted is provided on the sub mount substrate 38. A drive circuit 42 controlling the LD 34 is also provided on the sub mount substrate 38. A micro strip line 46 for transmitting an electrical signal fed into the LD 34 is formed on the print substrate 44. The micro strip line 46, the LD 34 and the drive circuit 42 are electrically connected to each other.

The first terminal 12 covered with the insulator 26 penetrates the mount substrate 40 and a bottom wall 54 of the chassis 10 and is fixed to the mount substrate 40 and the bottom wall 54. The first terminal 12 is electrically connected to the LD 34 and the drive circuit 42. Electrical power is supplied to the LD 34 and the drive circuit 42 via the first terminal 12. A control signal is transmitted to the drive circuit 42 via the first terminal 12. The second terminal 14 covered with the insulator 26 penetrates a sidewall 56 of the chassis 10 and is fixed to the sidewall 56. The second terminal 14 is coupled to the micro strip line 46 in an extending direction of the micro strip line 46. The second terminal 14 is electrically connected to the LD 34 and the drive circuit 42. An electrical signal to be converted into an optical signal at the LD 34 is fed into the LD 34 via the second terminal 14, the micro strip line 46 and the drive circuit 42.

A lid 48 is provided on an upper face of the chassis 10. Thus, the inside of the chassis 10 is hermetically sealed. The lid 48 is made of a metal such as a kovar that is the same material as the chassis 10. A lens holder 50 is fixed to the sidewall of the chassis 10 with a solder or the like. Thus, the lens holder 50 acts as a part of the chassis 10. The receptacle 20 is coupled to the second side face 28 of the chassis 10 (a side face of the lens holder 50). The lens holder 50 holds a lens 52 for collecting a laser light from the LD 34 so that the laser light is input into the optical fiber inserted into the receptacle 20. The projection portion 16 structured with the first projection portion 16a and the second projection portion 16b is provided on the bottom face 22 of the chassis 10. The LD 34, the drive circuit 42 and the projection portion 16 are electrically connected to each other via the bottom wall 54 of the chassis 10, the mount substrate 40 and the sub mount substrate 38.

Figure 6:
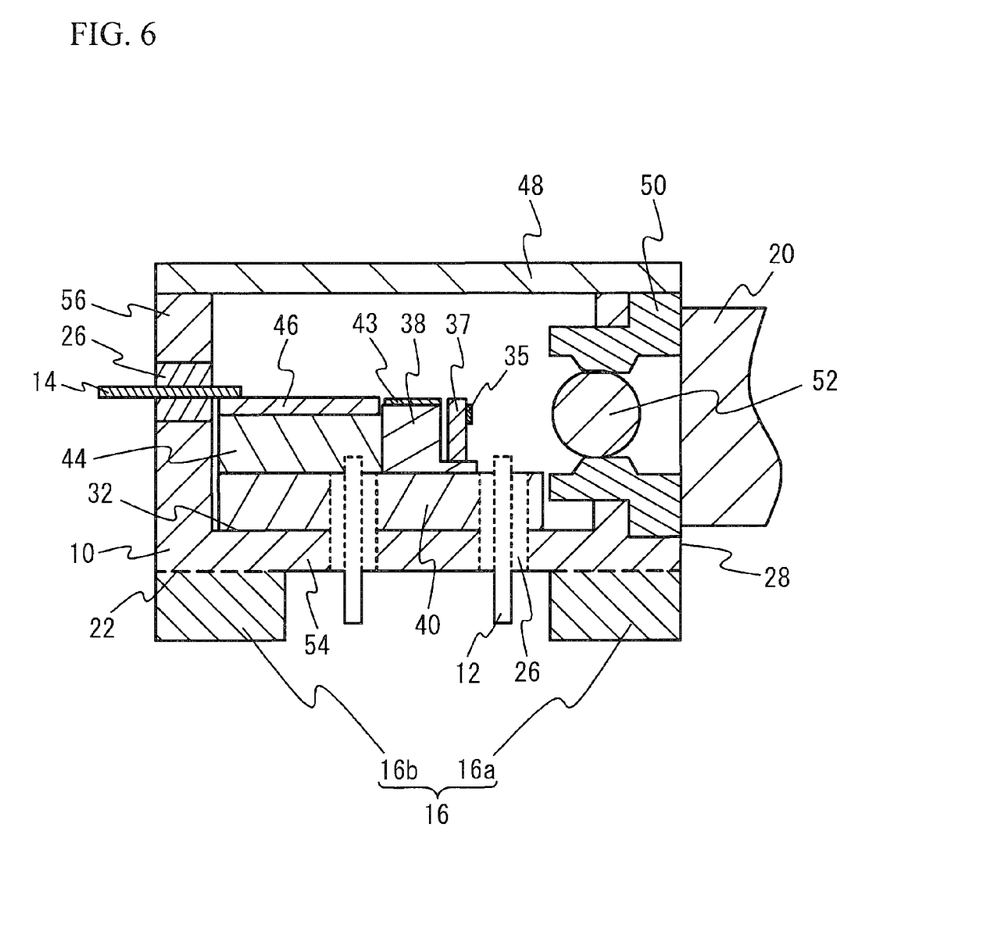
FIG. 6 illustrates a cross sectional view taken along a line A-A of FIG. 4A in a case where the optical element is a PD (photo diode)

FIG. 6 illustrates a cross sectional view taken along an A-A line of FIG. 4A. FIG. 6 illustrates a case where the optical element housed in the chassis 10 is a light-receiving element such as a photodiode. As illustrated in FIG. 6, the sub mount substrate 38 and the print substrate 44 are mounted on the mount substrate 40 provided on an inner bottom face 32 of the cavity of the chassis 10. A PD (photo diode) mount substrate 37 on which a PD 35 is mounted is provided on the sub mount substrate 38. A transimpedance amplifier 43 converting an electrical current generated at the PD 35 into a voltage is also provided on the sub mount substrate 38. The micro strip line 46 transmitting an electrical signal obtained by the conversion of an optical signal at the PD 35 is formed on the print substrate 44. The micro strip line 46, the PD 35 and the transimpedance amplifier 43 are electrically connected to each other.

The first terminal 12 penetrating the mount substrate 40 and the bottom wall 54 of the chassis 10 is electrically connected to the PD 35 and the transimpedance amplifier 43. Electrical power is supplied to the PD 35 and the transimpedance amplifier 43 via the first terminal 12. Alternately, a control signal is supplied to the transimpedance amplifier 43 via the first terminal 12. The second terminal 14 penetrating the sidewall 56 of the chassis 10 is electrically connected to the PD 35 and the transimpedance amplifier 43. An electrical signal converted from an optical signal at the PD 35 is output from the second terminal 14 via the transimpedance amplifier 43 and the micro strip line 46. The lens 52 held by the lens holder 50 collects a light having transmitted in an optical fiber inserted into the receptacle 20 to the PD 35. The other structure is the same as a case where the optical element of FIG. 5 is the LD 34. Therefore, explanation of the other structure is omitted.

The drive circuit 42 may not be provided in the case where the optical element of FIG. 5 is the LD 34. The transimpedance amplifier 43 may not be provided in the case where the optical element of FIG. 6 is the PD 35.

Figure 7A:
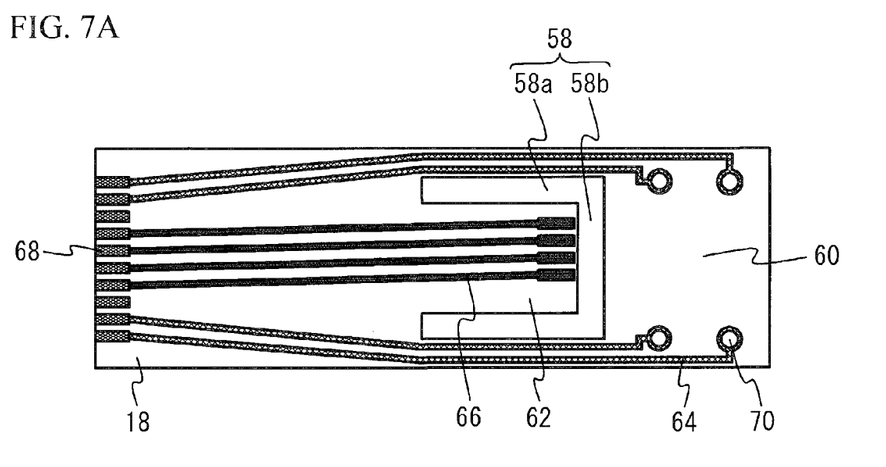
FIG. 7A illustrates a top view of a flexible printed circuit board.
Figure 7B:
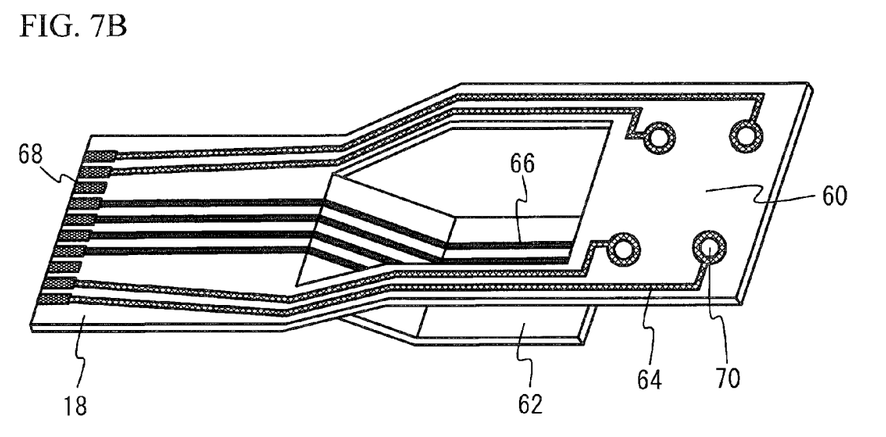
FIG. 7B illustrates a perspective view of the flexible printed circuit board viewed from an upper face side.

Next, a description will be given of the flexible printed circuit board 18 with reference to FIG. 7A and FIG. 7B. FIG. 7A illustrates a top view of the flexible printed circuit board 18. FIG. 7B illustrates a perspective view of the flexible printed circuit board 18 viewed from an upper face side. As illustrated in FIG. 7A and FIG. 7B, a cutting line 58 is formed in the center area of the flexible printed circuit board 18. The cutting line 58 includes a pair of facing first cutting line portions 58a and a second cutting line portion 58b connecting each end of the first cutting line portions 58a. The first cutting line portions 58a extend to the same direction as a long side of the flexible printed circuit board 18. The cutting line 58 divides the flexible printed circuit board 18 into a first area 60 and a second area 62. The first area 60 and the second area 62 are bent to the opposite side from each other. A first wiring 64 is provided on the first area 60. A second wiring 66 is provided on the second area 62. The first wiring 64 and the second wiring 66 are coupled to connector terminals 68 provided on the flexible printed circuit board 18. The connector terminal 68 is electrically connected to a print substrate having a control circuit. A through hole 70 is formed in the first area 60. The flexible printed circuit board 18 is, for example, made of a material including polyimide. The first wiring 64 and the second wiring 66 are made of a metal such as copper subjected to Au plating.

As illustrated in FIG. 1A through FIG. 2, the first area 60 of the flexible printed circuit board 18 is located on the bottom face 22 of the chassis 10, the first terminal 12 is inserted into the through hole 70 formed in the first area 60, and the first terminal 12 is coupled to the through hole 70 with soldering. Thus, the first terminal 12 is electrically connected to the first wiring 64. The second area 62 of the flexible printed circuit board 18 is coupled to the first side face 24 of the chassis 10 from a direction in parallel with an extending direction of the second terminal 14, and is coupled to the first side face 24 with soldering. That is, the second wiring 66 is coupled to the second terminal 14 from a direction in parallel with an extending direction of the second terminal 14. Thus, the second terminal 14 is electrically connected to the second wiring 66. The second projection portion 16b is located in an opening 72 formed in the flexible printed circuit board 18 because the flexible printed circuit board 18 is divided into the first area 60 and the second area 62.

As mentioned above, as illustrated in FIG. 4B, in the first embodiment, the projection portion 16 projecting more than the first terminal 12 extended from the bottom face 22 of the chassis 10 is provided on the bottom face 22 of the chassis 10 housing an optical element therein. Thus, the projection portion 16 protects the first terminal 12. Therefore, it is possible not only to extract the second terminal 14 from the first side face 24 of the chassis 10 but also to extract the first terminal 12 from the bottom face 22. It is accordingly possible to increase the number of terminal extended from the optical device. And, the projection portion 16 restrains the contact between the first terminal 12 and an external component such as a case. Further, it is possible to restrain damaging of the first terminal 12, an electrical short of the first terminal 12 with an external component, or the like.

As illustrated in FIG. 2 and so on, the flexible printed circuit board 18 divided into the first area 60 and the second area 62 by the cutting line 58 is coupled to the chassis 10 so that the first wiring 64 and the first terminal 12 provided on the first area 60 are electrically connected to each other and the second wiring 66 and the second terminal 14 provided on the second area 62 are electrically connected to each other. It is therefore possible to extract the first terminal 12 extended from the bottom face 22 of the chassis 10 and the second terminal 14 extended from the first side face 24 toward the side of the chassis 10 with use of a single sheet of the flexible printed circuit board 18. Therefore, a single sheet of the flexible printed circuit board 18 allows an electrical coupling between the first terminal 12 and a print substrate having a control circuit and between the second terminal 14 and the print substrate.

As illustrated in FIG. 7A, the through hole 70 is formed in the first area 60 of the flexible printed circuit board 18. As illustrated in FIG. 1B and FIG. 2, the first terminal 12 is electrically connected to the first wiring 64 when the first terminal 12 extended from the bottom face 22 of the chassis 10 is inserted into the through hole 70. Therefore, the first terminal 12 is electrically connected to the first wiring 64 completely.

As illustrated in FIG. 1B, the second projection portion 16b provided on the bottom face 22 of the chassis 10 is located in the opening 72 that is formed by dividing the flexible printed circuit board 18 into the first area 60 and the second area 62. It is therefore possible to use the area of the chassis 10 and the area of the flexible printed circuit board 18 effectively when the chassis 10 is coupled to the flexible printed circuit board 18.

As illustrated in FIG. 1A through FIG. 2, the second area 62 of the flexible printed circuit board 18 is coupled to the chassis 10 in a direction in parallel with the extending direction of the second terminal 14. That is, the second wiring 66 provided on the second area 62 is coupled to the second terminal 14 in a direction in parallel with the extending direction of the second terminal 14. Thus, loss caused by discontinuity between the second terminal 14 and the second wiring 66 is restrained and favorable high frequency property is obtained, if the second terminal 14 is used for inputting of high frequency electrical signal to be converted into an optical signal at the optical element or outputting of high frequency electrical signal converted from an optical signal at the optical element. It is therefore preferable that the second terminal 14 is used for inputting or outputting of electrical signal against the optical element housed in the chassis 10. It is preferable that the second wiring 66 of the flexible printed circuit board 18 is a high frequency transmission line transmitting a high frequency electrical signal such as a micro strip line or a coplanar transmission line. On the other hand, the first terminal 12 is electrically connected to the first wiring 64 when the first terminal 12 is inserted into the through hole 70. Therefore, the loss caused by the discontinuity between the first terminal 12 and the first wiring 64 becomes a problem when a high frequency electrical signal is transmitted in the first terminal 12. It is therefore preferable that the first terminal 12 is used as a terminal for electrical power supply to the optical element or an electrical component or a terminal for control of the electrical component.

As illustrated in FIG. 5, the mount substrate 40 where the LD 34 acting as the optical element and the drive circuit 42 acting as the electrical component are mounted or the mount substrate 40 where the FD 35 acting as the optical element and the transimpedance amplifier 43 acting as the electrical component are mounted is provided on the inner bottom face 32 of the cavity of the chassis 10. The optical element, the electrical component and the projection portion 16 are electrically connected to each other via the bottom wall 54 of the chassis 10 and the mount substrate 40. It is preferable that generated heat is released from a viewpoint of reliability, because the optical element and the electrical component generate heat. In particular, it is preferable that generated heat is released when the optical element is the LD 34, because the LD 34 and the drive circuit 42 tend to generate heat and the property of the LD 34 fluctuates because of the generated heat. In accordance with the first embodiment, the heat generated in the optical element or the electrical component is effectively released to a case via the bottom wall 54 of the chassis 10 and the projection portion 16 when the optical device is mounted on the case or the like, if the projection portion 16 supports the chassis 10 of the optical device. For example, it is thought that the lid 48 side provided on the upper face of the chassis 10 is attached to a case in order to restrain the contact between the first terminal 12 extended from the bottom face 22 of the chassis 10 and the case or the like. However, in the case, the heat generated in the optical element or the electrical component is released to the case or the like via the bottom wall 54 and the sidewall 56 of the chassis 10 and the lid 48. Therefore, radiation performance is low. It is therefore preferable that the bottom wall 54 side of the chassis 10 is attached to the case or the like in order to release the heat generated in the optical element or the electrical component effectively.

As illustrated in FIG. 3 through FIG. 4B, the first projection portion 16a forms the same plane as the second side face 28 of the chassis 10 to which the receptacle 20 is coupled. However, the first projection portion 16a may not form the same plane as the second side face 28 of the chassis 10. It is however preferable that the first projection portion 16a forms the same plane as the second side face 28 and extends from a first end of a side between the second side face 28 and the bottom face 22 to the second end of the side in order to secure sufficient area where the receptacle 20 is attached. The second projection portion 16b forms the same plane as the first side face 24 that is positioned on the opposite side of the second side face 28 to which the receptacle 20 is coupled. However, the second projection portion 16b may not form the same plane as the second side face 28 of the chassis 10 and may be provided on the first side face 24 side. It is preferable that the second projection portion 16b is not provided on whole area between the side faces of both sides of the first side face 24, because, in this case, the first area 60 of the flexible printed circuit board 18 is located on the bottom face 22 of the chassis 10.

Figure 8:
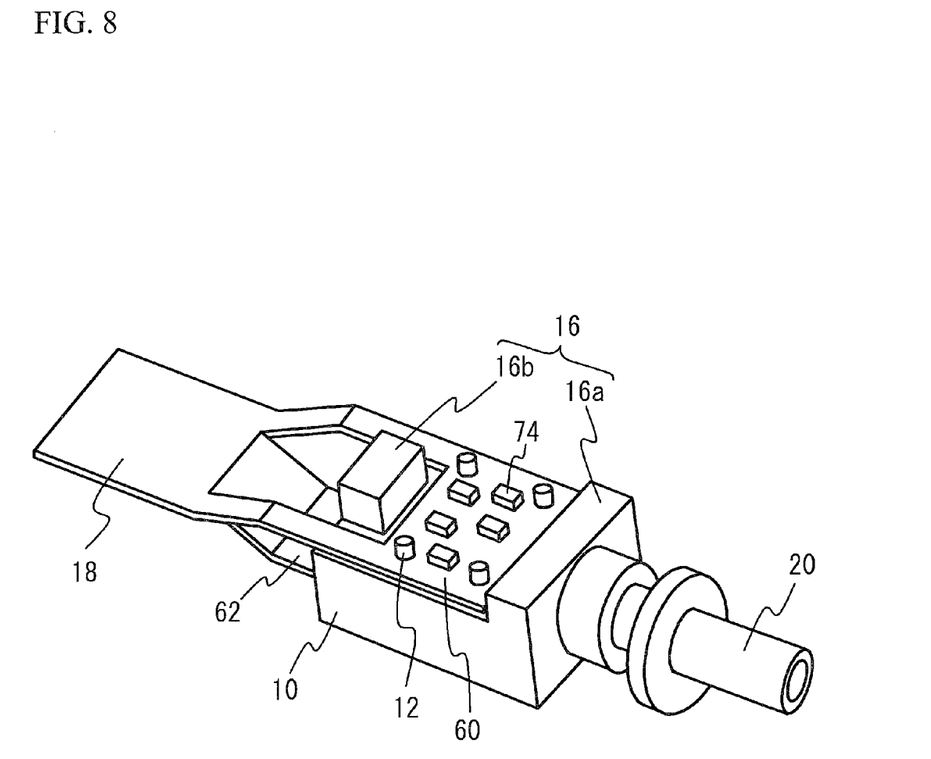
FIG. 8 illustrates a perspective view of an optical device in accordance with a first modified embodiment of the first embodiment viewed from a bottom face side.

FIG. 8 illustrates an example of a perspective view of the optical device in accordance with a first modified embodiment viewed from a bottom face side. In FIG. 8, the wirings and the connector terminals formed on the flexible printed circuit board 18 are omitted for simplification. As illustrated in FIG. 8, a chip component 74 such as a capacitor, a coil, a resistor and so on electrically connected to the optical element or the like housed in the chassis 10 is provided on the first area 60 of the flexible printed circuit board 18 located on the bottom face 22 of the chassis 10, in the optical device in accordance with the first modified embodiment of the first embodiment. The projection portion 16 projects more than the chip component 74. The other structure is the same as the first embodiment, and is illustrated in the FIG. 1A and FIG. 1B. Therefore, explanation of the other structure is omitted.

In accordance with the first modified embodiment of the first embodiment, the chip component 74 electrically connected to the optical element or the like is provided on a part of the first area 60 of the flexible printed circuit board 18 that is positioned at the bottom face 22 of the chassis 10. The projection portion 16 projects more than the chip component 74. Thus, the projection portion 16 protects the chip component 74. And, the contact between the chip component 74 and an external component is restrained.

Figure 9:
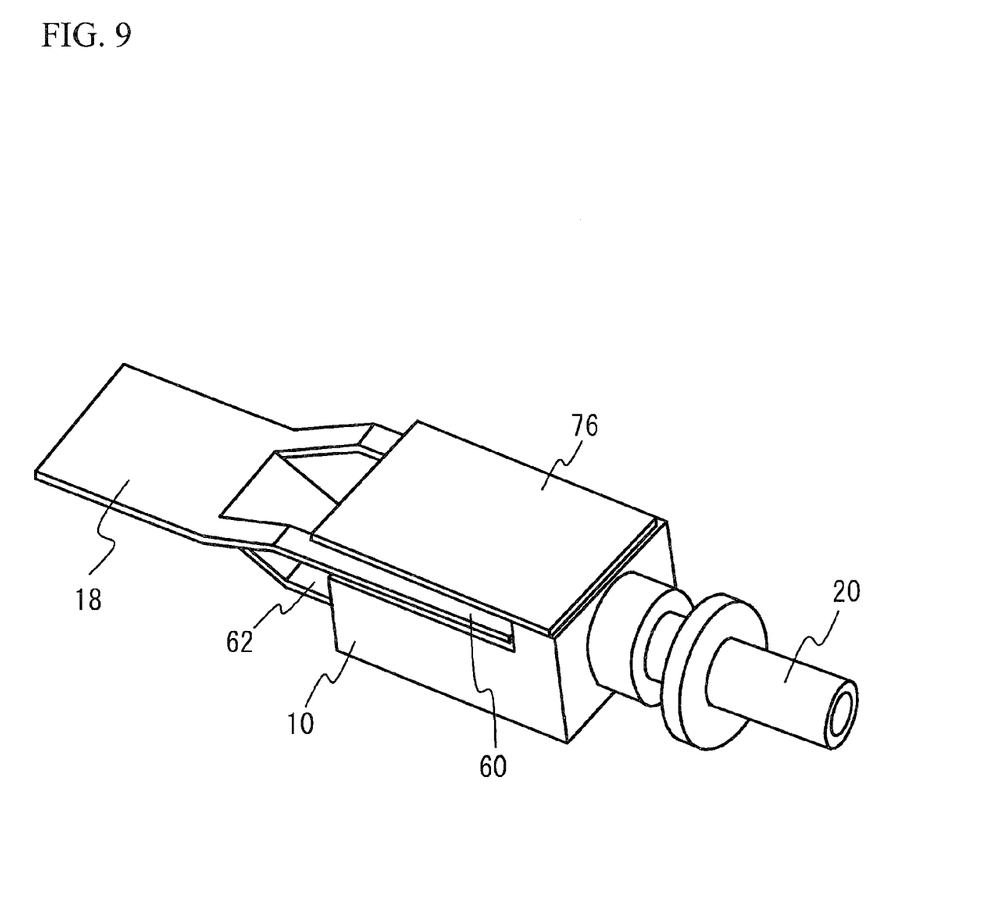
FIG. 9 illustrates a perspective view of an optical device in accordance with a second modified embodiment of the first embodiment viewed from a bottom face side.

FIG. 9 illustrates a perspective view of an optical device in accordance with a second modified embodiment of the first embodiment viewed from a bottom face side. In FIG. 9, the wirings and the connector terminals formed on the flexible printed circuit board 18 are omitted for simplification. As illustrated in FIG. 9, a cover plate 76 for package is provided from the first projection portion 16a to the second projection portion 16b. The cover plate 76 covers the first area 60 of the flexible printed circuit board 18. That is, the first terminal 12 is covered with the cover plate 76 for package. It is preferable that the cover plate 76 is made of a material having high thermal conductivity, in view of the radiation performance of the optical element housed in the chassis 10. For example, it is preferable that the cover plate 76 is made of a metal such as iron-nickel-cobalt alloy (KOVAR). The cover plate 76 may be made of an insulating material such as plastic when the insulating material has a given strength, if the radiation performance of the optical device has not to be considered.

The contact between the first terminal 12 and an external component is restrained because the cover plate 76 is coupled to the projection portion 16 and covers the first terminal 12. When the chip component 74 is provided as well as the first modified embodiment of the first embodiment, the contact between the chip component 74 and the external component is restrained.

Second Embodiment

Figure 10A:
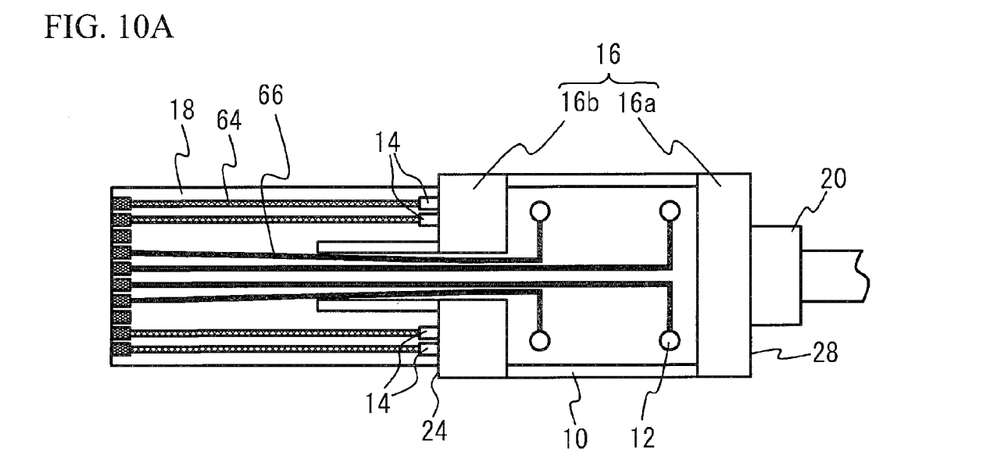
FIG. 10A illustrates a bottom view of an optical device in accordance with a second embodiment.
Figure 10B:
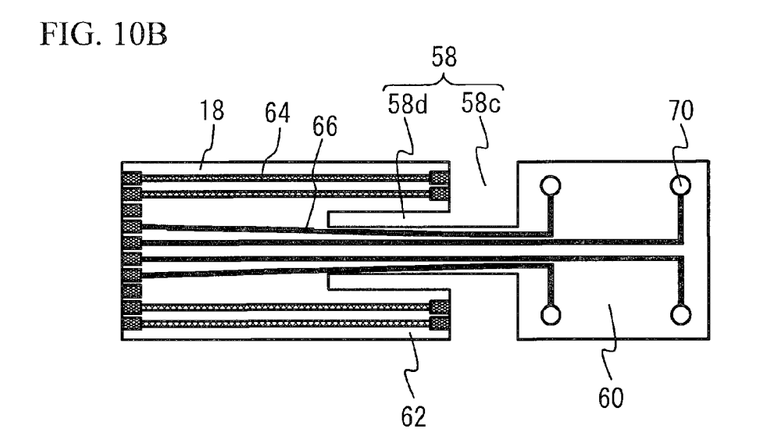
FIG. 10B illustrates a bottom view of a flexible printed circuit board.

FIG. 10A illustrates a bottom view of an optical device in accordance with a second embodiment. FIG. 10B illustrates a bottom view of a flexible printed circuit board used in the optical device in accordance with the second embodiment. In FIG. 10A and FIG. 10B, wirings and connector terminals are not illustrated for simplification. As illustrated in FIG. 10A, the projection portion 16 of the optical device in accordance with the second embodiment includes the first projection portion 16a forming the same plane as the second side face 28 of the chassis 10 and the second projection portion 16b that forms the same plane as the first side face 24 of the chassis 10 and is divided into two parts at corners of the chassis 10.

As illustrated in FIG. 10B, the flexible printed circuit board 18 has the cutting line 58 including two of third cutting line portions 58c formed from each facing side face of the flexible printed circuit board 18 and two of fourth cutting line portions 58d extending toward the same direction from the third cutting line portions 58c. The cutting line 58 divides the flexible printed circuit board 18 into the first area 60 and the second area 62. The first area 60 and the second area 62 are bent to the opposite side from each other. As illustrated in FIG. 10A, the second projection portion 16b is located at a position corresponding to the third cutting line portion 58c. The other structure is the same as the first embodiment. Therefore, explanation of the other structure is omitted.

In accordance with the optical device in accordance with the second embodiment, as illustrated in FIG. 10A, the projection portion 16 includes the first projection portion 16a forming the same plane as the second side face 28 of the chassis 10 and the two of second projection portions 16b that form the same plane as the first side face 24 and are positioned at the corners of the chassis 10. Even if the number of the second projection portion 16b provided on the first side face 24 side is two or more, the contact between the first terminal 12 extended from the bottom face 22 of the chassis 10 and an external component is restrained, as well as the first embodiment.

Third Embodiment

Figure 11A:
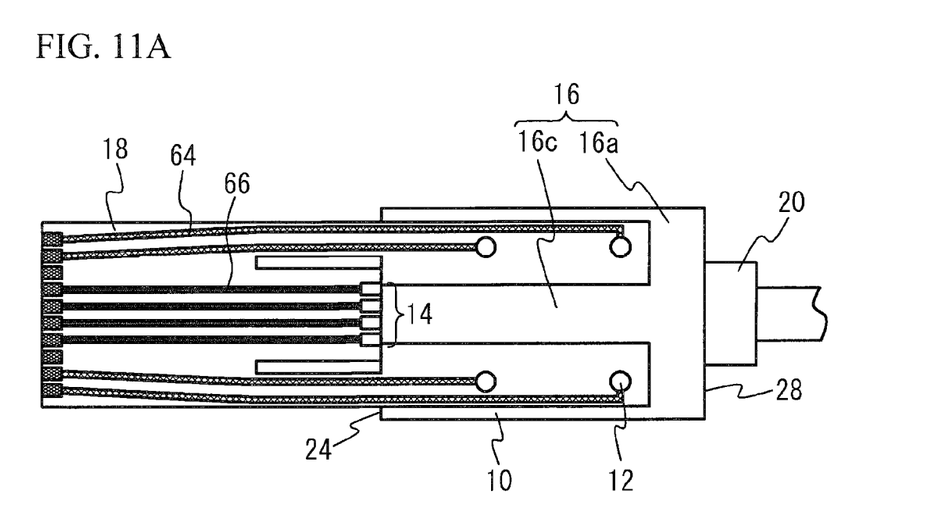
FIG. 11A illustrates a bottom view of an optical device in accordance with an optical device in accordance with a third embodiment.
Figure 11B:
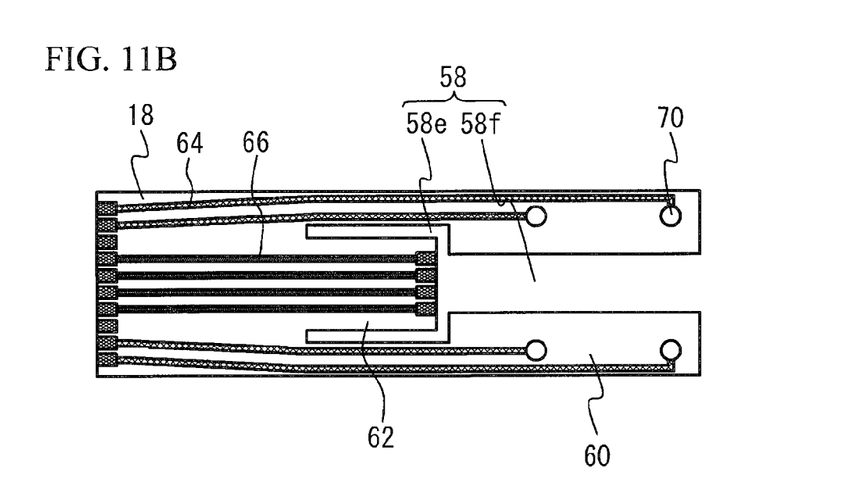
FIG. 11B illustrates a bottom view of a flexible printed circuit board.

FIG. 11A illustrates a bottom view of an optical device in accordance with a third embodiment. FIG. 11B illustrates a bottom view of a flexible printed circuit board used in the optical device in accordance with the third embodiment. In FIG. 11A and FIG. 11B, wirings and connector terminals are not illustrated for simplification. As illustrated in FIG. 11A, the projection portion 16 of the optical device in accordance with the third embodiment includes the first projection portion 16a forming the same plane as the second side face 28 of the chassis 10 and a third projection portion 16c extending toward the first side face 24 side from the second side face 28 side. That is, the projection portion 16 has T-shape.

As illustrated in FIG. 11B, the flexible printed circuit board 18 has the cutting line 58 including a fifth cutting line portion 58e and a sixth cutting line portion 58f. The fifth cutting line portion 58e includes a pair of first cutting line portions and a second cutting line portion. The pair of first cutting line portions face with each other and are formed in a center area of the flexible printed circuit board 18. The second cutting line portion connects each end of the pair of first cutting line portions. The cutting line 58 divides the flexible printed circuit board 18 into the first area 60 and the second area 62. The first area 60 and the second area 62 are bent to the opposite side from each other. As illustrated in FIG. 11A, the third projection portion 16c is located at a position corresponding to the sixth cutting line portion 58f. The other structure is the same as the first embodiment. Therefore, explanation of the other structure is omitted.

As illustrated in FIG. 11A, in the optical device in accordance with the third embodiment, the projection portion 16 includes the first projection portion 16a forming the same plane as the second side face 28 of the chassis 10 and the third projection portion 16c extending toward the first side face 24 side that is opposite side of the second side face 28 from the second side face 28. With the structure, it is restrained that the first terminal 12 extended from the bottom face 22 of the chassis 10 is in touch with an external component, as well as the first embodiment.

The third projection portion 16c may not extend to the first side face 24. The third projection portion 16c has only to extend so that the first terminal 12 is not in touch with an external component, even if the third projection portion 16c extends to the first side face 24.

The present invention is not limited to the specifically disclosed embodiments and variations but may include other embodiments and variations without departing from the scope of the present invention.

What is claimed is:

1. An optical device, comprising:
   a chassis that receives an optical element;
   a first terminal that is extended from a bottom face of the chassis and is electrically connected to the optical element;
   a second terminal that is extended from a side face of the chassis and is electrically connected to the optical element;
   a projection portion that is provided on the bottom face of the chassis and a top face of the projection portion is higher than a distal end of the first terminal;
   a flexible printed circuit board that is divided into a first area and a second area with a cutting line;
   a first wiring provided in the first area of the flexible printed circuit board that is electrically connected to the first terminal; and
   a second wiring provided in the second area of the flexible printed circuit board that is electrically connected to the second terminal.

2. The optical device as claimed in claim 1, wherein the first terminal is inserted into a through hole formed in the first area of the flexible printed circuit board.

3. The optical device as claimed in claim 1, wherein the projection portion is located in an opening formed in the flexible printed circuit board.

4. The optical device as claimed in claim 1, wherein the second wiring of the flexible printed circuit board is coupled to the second terminal in a direction that is in parallel with extending direction of the second terminal.

5. The optical device as claimed in claim 1, wherein:
   a chip component is provided on a part of the first area of the flexible printed circuit board that is positioned at the bottom face of the chassis; and
   the top face of the projection portion is higher than a top face of the chip component.

6. The optical device as claimed in claim 1, wherein:
   the optical element is a light emitting element or a light receiving element;
   the first terminal is a terminal for supplying electrical power to the optical element; and
   the second terminal is a terminal for inputting or outputting an electrical signal with respect to the optical element.

7. The optical device as claimed in claim 1, wherein the second wiring is a high frequency transmission line.

8. The optical device as claimed in claim 1, further comprising a cover plate that is fixed with the projection portion and covers the first terminal.

9. The optical device as claimed in claim 1, wherein the optical device has a plurality of the projection portions on the bottom face of the chassis.

10. The optical device as claimed in claim 9, wherein the optical device has a front side and a back side, the front side of the optical device having a receptacle of the optical element, the back side of the optical device being opposed to the front side, the plurality of the projection portions being located on the bottom face in association with the front and back sides of the optical element.

11. The optical device as claimed in claim 1, wherein the projection portion is made of a material of the chassis.

12. The optical device, comprising:
   a chassis that receives an optical element;
   a first terminal that is extended from a bottom face of the chassis and is electrically connected to the optical element;
   a second terminal that is extended from a side face of the chassis and is electrically connected to the optical element; and
   a projection portion that is provided on the bottom face of the chassis and a top face of the projection portion is higher than a distal end of the first terminal;
   wherein the projection portion is made of a material of the chassis; and
   wherein the material of the chassis is iron-nickel-cobalt alloy.

13. The optical device as claimed in claim 1, wherein the projection portion is contact with a portion of the optical device is attached.

14. The optical device as claimed in claim 5 further comprising a cover plate that is fixed with the projection portion and covers the chip component.

15. The optical device as claimed in claim 14, wherein the cover plate is made of plastic or iron-nickel-cobalt alloy.

16. The optical device as claimed in claim 1, wherein the projection portion has T-shape.

17. The optical device, comprising:
   a chassis that receives an optical element;

a first terminal that is extended from a bottom face of the chassis and is electrically connected to the optical element;

a second terminal that is extended from a side face of the chassis and is electrically connected to the optical element;

a projection portion that is provided on the bottom face of the chassis and a top face of the projection portion is higher than a distal end of the first terminal; and a flexible printed circuit board having a first area and a second area, the first area and the second area having an edge, the first area having a first wiring connected to the first terminal, the second area having a second wiring connected to the second terminal.

18. The optical device as claimed in claim 17, wherein:

the flexible printed circuit board has a plurality of the second area; and the first area is located between the second areas.

19. The optical device as claimed in claim 17, wherein:

the flexible printed circuit board has a plurality of the first area; and the second area is located between the first areas.

* * * * *